United States Patent
Yoo et al.

(10) Patent No.: US 6,744,284 B2
(45) Date of Patent: Jun. 1, 2004

(54) RECEIVER CIRCUIT OF SEMICONDUCTOR INTEGRATED CIRCUIT

(75) Inventors: Chang-Sik Yoo, Kyunggi-do (KR); Byong-Mo Moon, Seoul (KR); Ho-Young Song, Yongin-shi (KR)

(73) Assignee: Samsung Electronics Co, Ltd. (KR)

( * ) Notice: Subject to any disclaimer, the term of this patent is extended or adjusted under 35 U.S.C. 154(b) by 0 days.

(21) Appl. No.: 10/262,444

(22) Filed: Oct. 1, 2002

(65) Prior Publication Data

US 2003/0132779 A1 Jul. 17, 2003

(30) Foreign Application Priority Data

Jan. 11, 2002 (KR) .......................... 2002-1692
Jan. 23, 2002 (KR) .......................... 2002-3870

(51) Int. Cl.[7] .............................................. H03K 19/20
(52) U.S. Cl. ........................... 326/95; 328/105; 327/77
(58) Field of Search ..................... 326/93–98, 112, 326/115; 327/77, 63–65

(56) References Cited

U.S. PATENT DOCUMENTS

| 5,729,159 A | * | 3/1998 | Gersbach ................. 327/52 |
| 5,825,209 A | * | 10/1998 | Stark et al. ................. 327/3 |
| 6,046,612 A | * | 4/2000 | Taft ........................ 327/77 |
| 2002/0027449 A1 | * | 3/2002 | Keeth ....................... 326/87 |
| 2003/0094985 A1 | * | 5/2003 | Heo et al ................... 327/202 |

FOREIGN PATENT DOCUMENTS

| JP | 6-243685 | 9/1994 | ......... G11C/11/409 |
| KR | 10-0258362 | 3/2000 | ......... H01L/27/082 |

* cited by examiner

*Primary Examiner*—Don Le
(74) *Attorney, Agent, or Firm*—Mills & Onello LLP

(57) ABSTRACT

Described is a receiver circuit reducing kick-back noises, due to coupling capacitance from a pair of differential input transistors when a system clock is rising up to a high level, by connecting drain nodes of the differential input transistors, which respond to a reference voltage and a data signal, respectively, while the system clock is at a low level, to a ground voltage.

30 Claims, 8 Drawing Sheets

RECEIVER CIRCUIT OF SEMICONDUCTOR INTEGRATED CIRCUIT

This application relies for priority upon Korean Patent Application No. 2002-3870, filed on Jan. 23, 2002, and Korean Patent Application No. 2002-01692, filed on Jan. 11, 2002, the contents of which are herein incorporated by reference in their entirety.

FIELD OF THE INVENTION

The present invention relates generally to the field of receiving of data input to semiconductor integrated circuits, and more specifically, to receiver circuits to transfer external signals to internal circuits in the integrated circuit chips.

BACKGROUND OF THE INVENTION

The transmission of data between integrated circuits such as high-speed digital circuits may be broken down to a timing budget in the overall system architecture. When data is received by an integrated circuit, it is typically buffered and latched and only after buffering and latching the data is considered successfully captured. In high-speed digital circuits, the faster the data can be latched, the further data can be transmitted. During input operations in digital circuits, data enters the integrated circuit through receiver circuits and the data signal is buffered and fed to a latch. The data is captured by the latch on an edge or level of a system clock. To optimize this process, various input circuit implementations have been devised to minimize the delay through the buffer and setup time of the latch. For instance, design and placement of input buffer and latch circuit components may minimize this time, but currently resulting in some portion of the overall timing budget.

FIG. 1 shows circuit architecture of a receiver circuit embedded in a semiconductor integrated circuit such as a synchronous DRAM to receive an external signal and to convert the external signal into an internal signal with a CMOS digital level, including a pre-amplifier 10, a first amplifier 30, and a second amplifier 50.

The pre-amplifier 10 is formed of resistors 11 and 12, a pair of differential input transistors 13 and 14, and a control transistor 15. Gates of the differential input transistors 13 and 14 are coupled to a data signal D and a reference voltage Vref, respectively. The differential input transistors 13 and 14 become conductive when a bias voltage Vbias applied to a gate of the control transistor 15 is charged up to a high level (e.g., 0.8V) enough to turn the control transistor on. On an sufficiently high-leveled Vbias, voltages at drain nodes of the differential input transistors 13 and 14 are output as differential signals PQB and PQ, respectively, according to a voltage difference between the data signal D and the reference voltage Vref.

In the first amplifier 30, including a pair of precharge transistors 31 and 32, a pair of constant-current transistors 33 and 34, a pair of equalizing transistors 35 and 36, a pair of voltage detection transistors 37 and 38, a pair of differential input transistors 39 and 40, an a pair of control transistors 41 and 42, differential signals IQ and IQB are made from voltages at drain nodes of the voltage detection transistors while a clock signal CLK is at a high level after receiving the differential signals PQB and PQ from the pre-amplifier 10. The second amplifier 50, including a pair of precharge transistors 53 and 54, a pair of constant-current transistors 55 and 56, a pair of inverters 57 and 58, a pair of voltage detection transistors 59 and 60, and a pair of differential input transistors 61 and 62, provides amplified differential signals Q and QB into internal circuits of an integrated circuit, which are generated at drain nodes of the voltage detection transistors 59 and 60 after amplifying the signals IQB and IQ supplied from the first amplifier 30.

In the receiver circuit 1, an on-resistance of the differential input transistor 13 becomes larger than that of the transistor 14 when a voltage level of the data signal D is higher than the reference voltage Vref, resulting in a lower drain voltage of the transistor 13 under a drain voltage of the transistor 14. Thus, the differential signal PQB is lowered under the differential signal PQ. With PQB lower than PQ, an on-resistance of the transistor 39 becomes larger than that of the transistor 40. Thus, the drain voltage IQ of the transistor 37 goes up to a higher level over the drain voltage IQB of the transistor 38. And, with IQ higher than IQB, an on-resistance of the transistor 61 becomes smaller than that of the transistor 62, resulting in a lower drain voltage of the transistor 59 under a drain voltage of the transistor 60. As a result, the data signal D lower than the reference voltage Vref makes a voltage level of the differential output signal Q higher than that of the differential output signal QB.

When a voltage level of the data signal D is lower than the reference voltage Vref, an on-resistance of the differential input transistor 13 becomes smaller than that of the differential input transistor 14, resulting in a higher drain voltage of the transistor 13 over a drain voltage of the transistor 14. Thus, the differential signal PQB rises over the differential signal PQ. With PQB higher than PQ, an on-resistance of the transistor 39 becomes smaller than that of the transistor 40. Thus, the drain voltage IQ of the transistor 37 drops to a lower level under the drain voltage IQB of the transistor 38. And, with IQ higher than IQB, an on-resistance of the transistor 61 becomes larger than that of the transistor 62, resulting in a higher drain voltage of the transistor 59 over a drain voltage of the transistor 60. As a result, the data signal D leveled higher than the reference voltage Vref makes a voltage level of the differential output signal Q lower than that of the differential output signal QB.

In a practical implementation, the data signal D may swing in the range of 1.2V±0.4V when the reference voltage Vref is set at 1.2V.

As well known, the control transistor 15 as an NMOS transistor is saturated in the condition of:

$$Vds \geq (Vgs - Vth) \qquad \text{Equation 1}$$

The drain voltage Vds of the control transistor 15 may be obtained from the following if the bias voltage Vbias applied to the gate of the control transistor 15 is 0.8V and the threshold voltage Vth of the control transistor 15 is 0.4V:

$$Vds = 0.8 - 0.4 - \Delta \qquad \text{Equation 2}$$

where Δ is an over-drive voltage approximately over 0.1V.

For instance, when Δ is 0.1V, Vds becomes 0.3V. This result is incapable of satisfying the saturation condition of Equation 1, still situating the control transistor 15 in an unstable operation state.

Decreasing the bias voltage Vbias to 0.7V from 0.8V may achieve a stabilized conductive state of the control transistor 15 because it is saturated by the condition of Vds=0.7−0.4. However, such a decrement of the bias voltage Vbias from 0.8V to 0.7V is accompanied by an up-sizing of the control transistor, increasing a junction capacitance thereof and decreasing a common mode rejection ratio at a high frequency.

Moreover, as the pre-amplifier 10 is forced into a conductive state just in response to the bias voltage Vbias regardless of input of the data signal D, unnecessary current consumption in the receiver circuit 1 results even without a valid input of the data signal D.

The receiver circuit 1 may be modified without the pre-amplifier to eliminate the unnecessary current consumption, by directly connecting the reference voltage Vref and the data signal D to gates of the differential input transistors 39 and 40, respectively, while switches SW1~SW4 are set to be normally turned on and nodes a~d are cut off.

With the cutdown architecture of the receiver circuit, the control transistors 41 and 42 are turned off when the clock signal CLK is on a low level and the drain nodes of the differential input transistors 39 and 40 are charged up to VDD−Vth37 (Vth37 is the threshold voltage of the transistor 37) and VDD−Vth38 (Vth38 is the threshold voltage of the transistor 38), respectively, through the precharge transistors 31 and 32. If the clock signal CLK goes up to a high level, the control transistors 41 and 42 are turned on and the drain nodes of the transistors 39 and 40 drops to a ground voltage (i.e., 0V).

During this process, coupling capacitances are formed between the gate and drain nodes, and the gate and source nodes, of the differential input transistors 39.

It is generally known that an integrated circuit is comprised of a multiplicity of input terminals each of which is associated with a receiver circuit as shown in FIG. 1. A sum of the coupling capacitance at the differential input transistors, under the condition in which the reference voltage Vref is applied to a number of receiver circuits, acts as noise degrading the reference voltage level when the drain node of the transistor 39 is being discharged to 0V. Such an effect is called "kick-back noise". While a large enough swing width of the data signal D may not affect normal operation of a receiver circuit even with a lower reference voltage, a decreased swing width of the data signal causes difficulty in detecting a voltage difference between them in the receiver circuit.

SUMMARY OF THE INVENTION

It is thus an object of the present invention to provide a receiver circuit capable of enhancing accuracy in detecting a data signal.

It is another object of the present invention to provide a receiver circuit capable of detecting a data signal with decreased kick-back noise.

According to an aspect of the present invention, there is provided a receiver circuit converting a data signal to a pair of output signals in response to a clock signal, comprising: a first circuit for developing a voltage difference between the data signal and a reference voltage and for outputting the voltage difference from a pair of terminals, when the clock signal is in a first state; and a second circuit for generating the output signals amplified from outputs of the first circuit. In particular, the first circuit comprises: an amplifier for precharging a pair of nodes thereof when the clock signal is in a second state and for developing a voltage difference between the nodes during the first state of the clock signal; a pair of switching transistors, being connected to the nodes, respectively, whose gates are coupled to the clock signal; and a pair of input transistors, connected between the switching transistors and a ground voltage, respectively, whose gates are coupled to the reference voltage and the data signal.

In one embodiment, the switching and input transistors are NMOS transistors.

The switching transistors connect the nodes to the input transistors during the first state of the clock signal.

The first circuit further comprises a constant-current circuit for supplying a current statically to the output terminals during the first state of the clock signal. The constant-current circuit includes a pair of constant-current transistors connected between a power supply voltage and the output terminals, respectively, whose gates and drains are cross-coupled to each other The amplifier comprises: a pair of precharge transistors of PMOS transistors, being connected between a power supply voltage and the output terminals, respectively, whose gates are coupled to the clock signal; and a pair of voltage detection transistors of NMOS transistors, being connected between the output terminals and the nodes, whose gates and drains are cross-coupled to each other.

According to another aspect of the invention, there is provided a receiver circuit converting a data signal to a pair of output signals in response to a clock signal, comprising: a first circuit for developing a voltage difference between the data signal and a reference voltage and for outputting the voltage difference from a pair of terminals, when the clock signal is in a first state; and a second circuit for generating the output signals amplified from outputs of the first circuit, in which the first circuit comprises: an amplifier for precharging a pair of nodes thereof when the clock signal is in a second state and for developing a voltage difference between the nodes during the first state of the clock signal; a pair of switching transistors, being connected to the nodes, respectively, whose gates are coupled to the clock signal; a pair of input transistors, connected between the switching transistors and a ground voltage, respectively, whose gates are coupled to the reference voltage and the data signal; and a resistor connected between the input transistors.

In still another aspect of the invention, a receiver circuit, for converting a data signal to a pair of output signals in response to a clock signal, comprises: a first circuit for developing a voltage difference between the data signal and a reference voltage and for outputting the voltage difference from a pair of terminals, when the clock signal is in a first state; and a second circuit for generating the output signals amplified from outputs of the first circuit, in which the first circuit comprises: an amplifier for precharging a pair of nodes thereof when the clock signal is in a second state and for developing a voltage difference between the nodes during the first state of the clock signal; a pair of switching transistors, being connected to the nodes, respectively, whose gates are coupled to the clock signal; a pair of input transistors, connected between the switching transistors and a ground voltage, respectively, whose gates are coupled to the reference voltage and the data signal; and a pair of discharge transistors, being connected between the input transistors, respectively, and the ground voltage, whose gates are coupled to the reference voltage and the data signal, respectively.

The first circuit may further include a delay circuit for transferring the clock signal with a predetermined delay time. The gates of the discharge transistors being coupled to a delayed clock signal provided from the delay circuit.

The present invention will be better understood from the following detailed description of the exemplary embodiment thereof taken in conjunction with the accompanying drawings, and its scope will be pointed out in the appended claims.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENT

Figure 2:
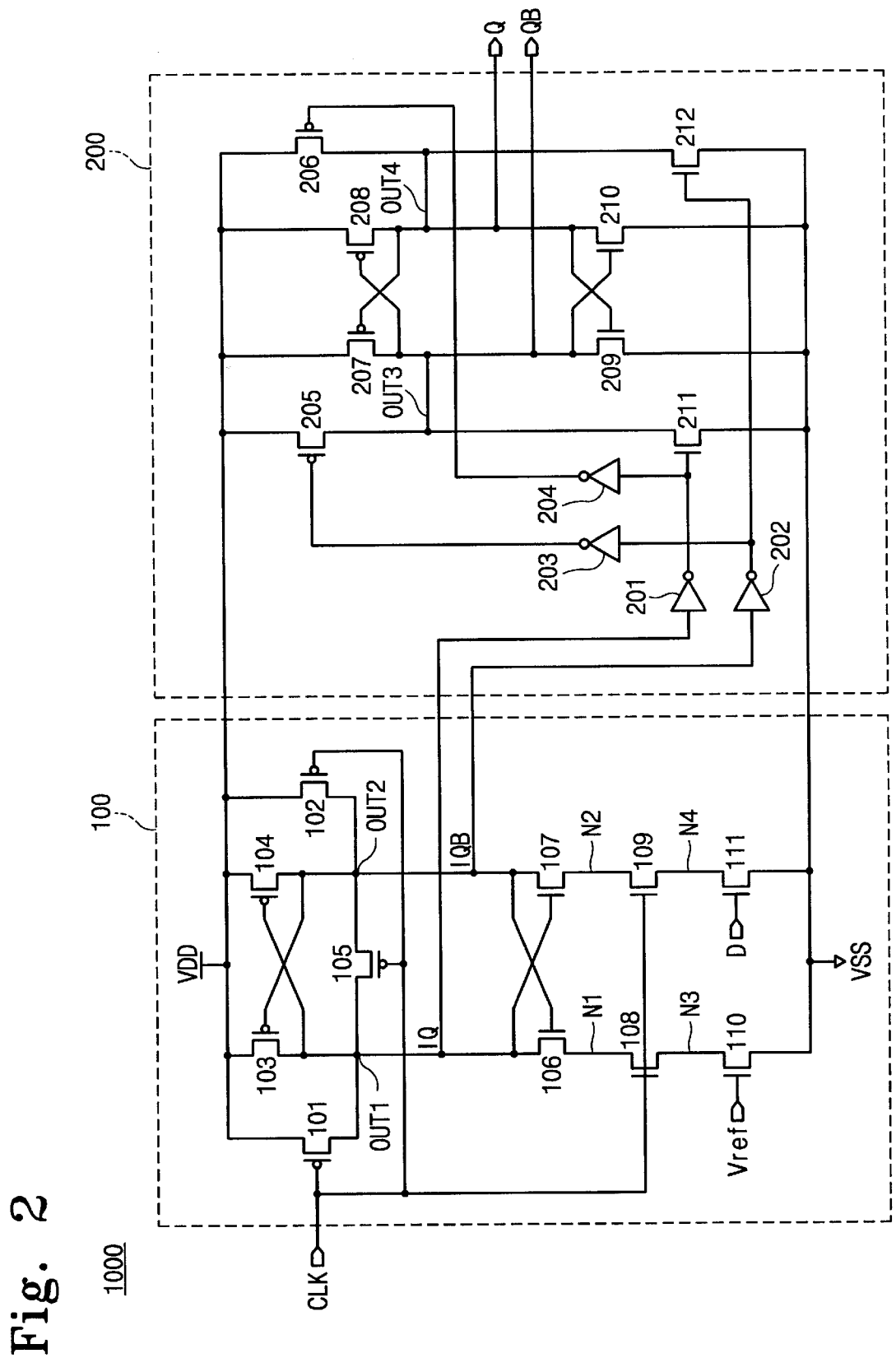
FIG. 2 is a circuit diagram of a receiver circuit according to an embodiment of the invention.

FIG. 2 shows a detail structure of a receiver circuit according to an embodiment of the invention. Referring to FIG. 2, the receiver circuit 1000 is composed of a first latched amplifier 100 receiving a reference voltage Vref and an input data signal D, and a second latched amplifier 200 generating output signals Q and QB after receiving differential outputs IQ and IQB from the first latched amplifier 100.

The first amplifier 100 includes a pair of precharge transistors 101 and 102, a pair of constant-current transistors 103 and 104, an equalizing transistor 105, a pair of voltage detection transistors 106 and 107, a pair of switching transistors 108 and 109, and a pair of differential input transistors 110 and 111. The precharge transistors 101 and 102, the constant-current transistors 103 and 104, and the equalizing transistor 105 are all PMOS transistors, while the voltage detection transistors 106 and 107, the switching transistors 108 and 109, and the differential input transistors 110 and 111 are all NMOS transistors.

Sources of the precharge transistors are connected to the power supply voltage VDD, and their drains are connected to output nodes OUT1 and OUT2, respectively, from which the differential signals IQ and IQB are generated. Gates of the precharge transistors are coupled to the clock signal CLK in common. Sources of the constant-current transistors 103 and 104 are connected to the power supply voltage VDD, and their drains and gates are cross-coupled to each other with being connected to the output nodes OUT1 and OUT2. A drain and source of the equalizing transistor 105 are connected to the output nodes OUT1 and OUT2, respectively, and its gate is coupled to the clock signal CLK.

Sources of the voltage detection transistors 106 and 107 are connected to nodes N1 and N2, respectively, and their drains and gates are cross-coupled to each other and are connected to the output nodes OUT1 and OUT2. Drains of the switching transistors 108 and 109 are connected to the nodes N1 and N2, respectively, while their sources are connected to nodes N3 and N4. Gates of the switching transistors are coupled to the clock signal CLK in common. Drains of the differential input transistors 110 and 111 are connected to the nodes N3 and N4, while their sources are connected to the ground voltage, and their gates are connected to the reference voltage Vref and the data signal D, respectively.

The first differential signals IQ and IQB at the output nodes OUT1 and OUT2 are provided to the second latched amplifier 200.

The second latched amplifier 200 includes inverters 201~204, PMOS transistors 205~208, and NMOS transistors 209~212. The inverters 201 and 202 receive the first differential signals IQ and IQB from the output nodes OUT1 and OUT2 of the first latched amplifier 100. The inverter 203 receives an output of the inverter 202 while the inverter 204 receives an output of the inverter 201. Sources of the PMOS transistors 205 and 206 are connected to the power supply voltage VDD while their drains are connected to output nodes OUT3 and OUT4, respectively. Gates of the PMOS transistors 205 and 206 are coupled to outputs of the inverters 203 and 204, respectively. Sources of the PMOS transistors 207 and 208 are connected to the power supply voltage VDD while their drains and gates are cross-coupled to each other and are connected to the output nodes OUT3 and OUT4, respectively.

Drains and gates of the NMOS transistors 209 and 210 are cross-coupled to each other and are connected to the output nodes OUT3 and OUT4, respectively, while their sources are connected to the ground voltage. Drains of the NMOS transistors 211 and 212 are connected to the output nodes OUT3 and OUT4, respectively while their sources are connected to the ground voltage. Gates of the NMOS transistors 211 and 212 are coupled to the outputs of the inverters 201 and 202, respectively.

In an operation with the structure of the receiver circuit shown in FIG. 2, when the clock signal CLK is at a low level, the precharge transistors 101 and 102 of the first amplifier 100 are all turned on to precharge the output nodes OUT1 and OUT2. The precharging of the output nodes OUT1 and OUT2 turns the voltage detection transistors 106 and 107 on to charge the nodes N1 and N2 up to VDD−Vth106 (Vth106 is a threshold voltage of the transistor 106) and VDD−Vth107 (Vth107 is a threshold voltage of the transistor 107), respectively. At this time, as the switching transistors 108 and 109 are all being non-conductive, there are no electrical connections between the nodes N1 and N3, and between the nodes N2 and N4. And, as the differential input transistor 110 is being conductive by the reference voltage Vref, the node N3 retains a voltage near the ground voltage VSS. When the first differential signals OUT1 and OUT2 are all high levels by the precharge operation for the output nodes OUT1 and OUT2, all the outputs of the inverters 203 and 204 in the second amplifier 200 become high levels and the second differential signals Q and QB at the output nodes OUT3 and OUT4 are in a floating state (not biased).

If the clock signal CLK changes to a high level, the precharge transistors 101 and 102 and the equalizing transistors 105 are turned off and the constant-current transistors 103 and 104 are turned on. Therefore, the output nodes OUT1 and OUT2 are charged up by the current supplied through the constant-current transistors 103 and 104. And, electrical connections between the nodes N1 and N3 and between the nodes N2 and N4 enable the first amplifier 100 to sense and develop a voltage difference between the data signal D and the reference voltage Vref.

If a current voltage of the data signal D 1.8V is higher than the reference voltage Vref 1.4V, assuming the reference voltage Vref is 1.4V and the data signal D swings between 1.8V and 1.0V, an on-resistance of the transistor 111 is smaller than that of the transistor 110 when the clock signal CLK is at a high level. Thus, a source voltage of the voltage detection transistor 107, i.e., a voltage at the node N2, becomes lower than a source voltage of the transistor 106, i.e., a voltage at the node N1. As a result, a voltage of IQB is below a voltage of IQ.

On the contrary, if the data signal D is applied thereto at 1.0V lower than the reference voltage Vref, an on-resistance of the transistor 111 becomes larger than that of the transistor 110 and thereby a voltage at the node N2 is below a voltage of the node N1. Thus, a voltage of IQB is higher than that of IQ.

Regarding the operation of the first latched amplifier 100 when the clock signal CLK turns to a high level from a low level, the voltage at the node N3 that has retained the ground voltage VSS during the clock signal CLK was a low level increases to a predetermined voltage level in response to the turn-on of the switching transistor 108 and then falls down to the ground voltage VSS. At this time, the maximum voltage rising at the node N3 is about 0.5×(VDD−Vth). It could be compared with the conventional case in which the transistor 39 is turned on in response to the high-leveled clock signal after turning off in response to the low-level clock signal and the reference voltage is influenced from the coupling capacitance when the drain nodes of the differential input transistors are discharged to 0V from VDD−Vth. Otherwise, the drain node of the differential input transistor 110, i.e., the node N3, falls down to 0V after rising up to the maximum voltage 0.5×(VDD−Vth) when the clock signal CLK are turning to a high level from a low level. Such a pre-boosting of the node N3 before the voltage drop to 0V reduces the kick-back noise half as much as the conventional one does.

Figure 1:
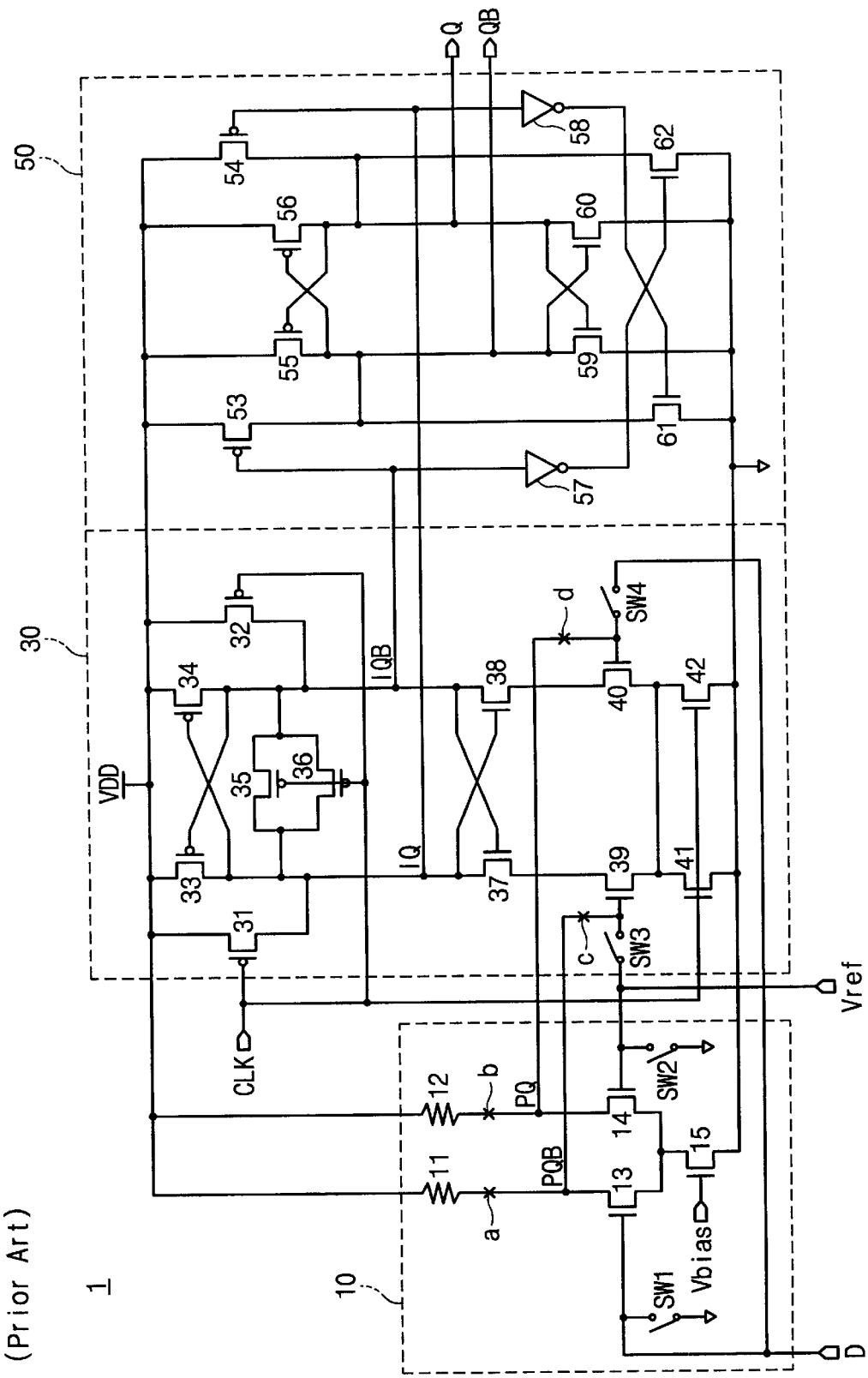
FIG. 1 is a circuit diagram of a receiver circuit employed in a synchronous DRAM.
Figure 3A:
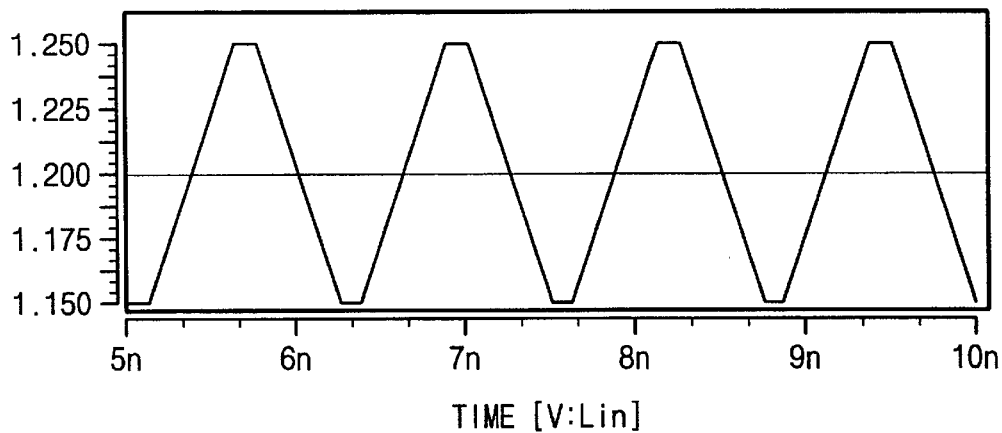
FIG. 3A is a timing diagram of data signals applied to the receiver circuit shown in FIG. 2.
Figure 3B:
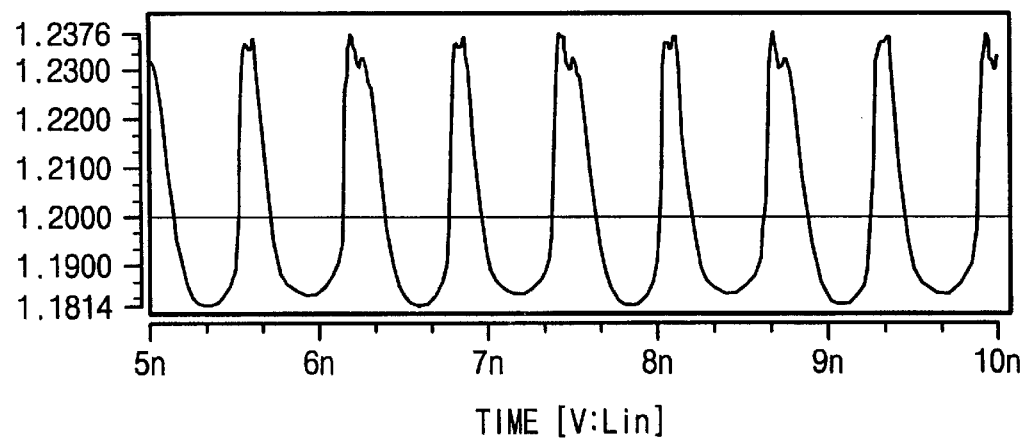
FIG. 3B is a timing diagram showing a variation of a reference voltage when the data signal shown in FIG. 3A is applied to the receiver circuit of FIG. 2.
Figure 3C:
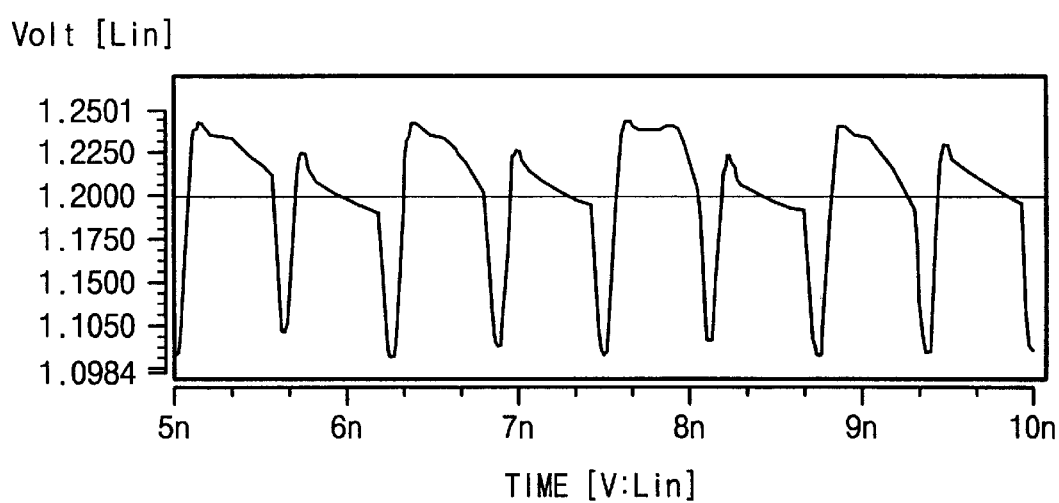
FIG. 3C is a timing diagram of a variation of the reference voltage when the data signal of FIG. 3A is applied to a first amplifier of the receiver circuit without a pre-amplifier shown in FIG. 1.

FIG. 3A shows a waveform of the data signal D applied to the receiver circuit of FIG. 2, FIG. 3B shows an experimental variation of the reference voltage Vref when the data signal D shown in FIG. 3A is applied to the receiver circuit of FIG. 2, and FIG. 3C shows an experimental variation of the reference voltage Vref when the data signal D shown in FIG. 3A is applied to the conventional receiver circuit of FIG. 1 without the preamplifier. It is assumed that the reference voltage Vref for FIGS. 3B and 3C is associated with 16 receiver circuits as examples.

It can be seen from FIG. 3A that the data signal D swings between 1.25V and 1.15V. While being supplied to the receiver circuit with 1.2V, the present reference voltage Vref shown in FIG. 3B rises up to 1.2476V when the data signal D is applied to the receiver circuit. That is, the maximum fluctuation range of the reference voltage is 1.2476−1.2= 0.0476V. Referring to FIG. 3C, the conventional reference voltage falls to 1.0984, the maximum fluctuation range of which is 1.2−1.0984=0.1016V.

From the experimental results comparing the present and conventional conditions, the reference voltage Vref in the present receiver circuit varies in a half fluctuation range (0.0476V) of the conventional one (0.1016) approximately. As a malfunctioned case in the conventional receiver circuit in which the conventional reference voltage downs to 1.0984V from 1.2V for the data signal D of 1.15V, the data signal D may read as higher than the reference voltage though it must detect the data signal D as lower than the reference voltage because the valid reference voltage 1.2V is higher than the current voltage level of the data signal D, i.e., 1.15V. However, the present receiver circuit regulates the voltage range of the reference voltage within 1.23~1.18V that is narrower than that of the data signal D, 1.25~1.15V, resulting in precise sensing and amplifying results for the data signal D.

The receiver circuit shown in FIG. 2 can be modified in various forms with respect to the subject of the present invention, as shown in FIGS. 4 through 7.

Figure 4:
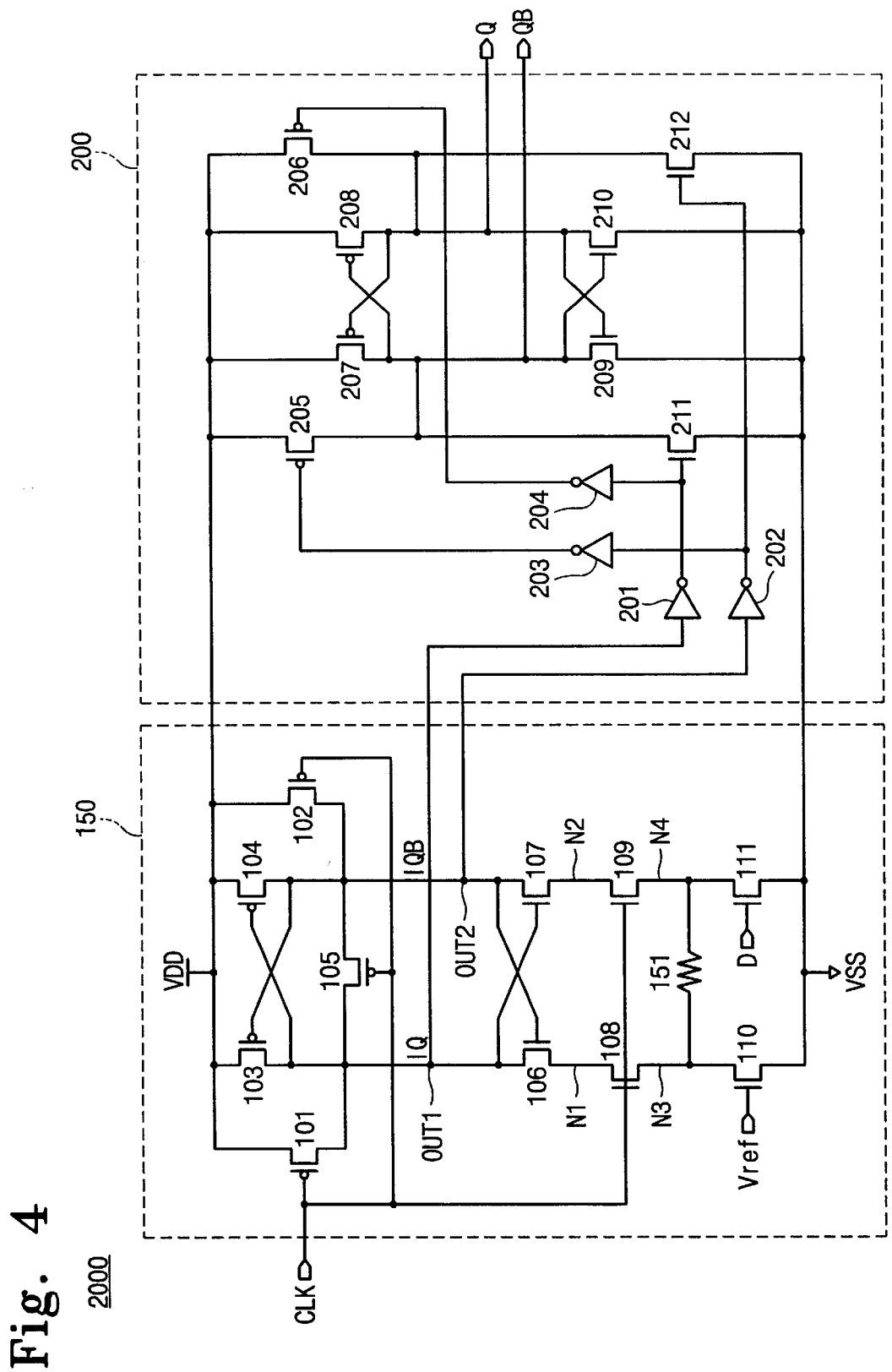
FIGS. 4 through 7 are circuit diagrams of various embodiments of receiver circuits in accordance with the invention.

First, referring to FIG. 4, the receiver circuit 2000 adds a resistor 151, with a very large resistance, between the nodes N3 and N4 in a first latched amplifier 150 (corresponding to 100 of FIG. 2). When the clock signal CLK is in a low level, the node N4 is conditioned in a floating state responding to a transition of the data signal D to a lower level under the threshold voltage of the differential input transistor 11. As a result, the voltage level of the data signal D can change by a coupling capacitance at the transistor 111, in which the data signal D goes up to a higher level over the threshold voltage of the transistor 111 when the clock signal CLK turns to a high level from a low level.

During this operation, since the coupling capacitance at the differential input transistor 111 would disturb an accurate sensing of the voltage level of the data signal D, the resistor 151 interposed between the nodes N3 and N4 connects the node N4 to the ground voltage VSS, preventing it from being in a floating state, in a turn-off state of the transistor 111. Thus, it permits the maximum voltage of the drain node of the transistor 111 to be up to 0.5×(VDD−Vth), reducing the voltage fluctuation rate of the data signal D due to the coupling capacitance therein.

Figure 5:
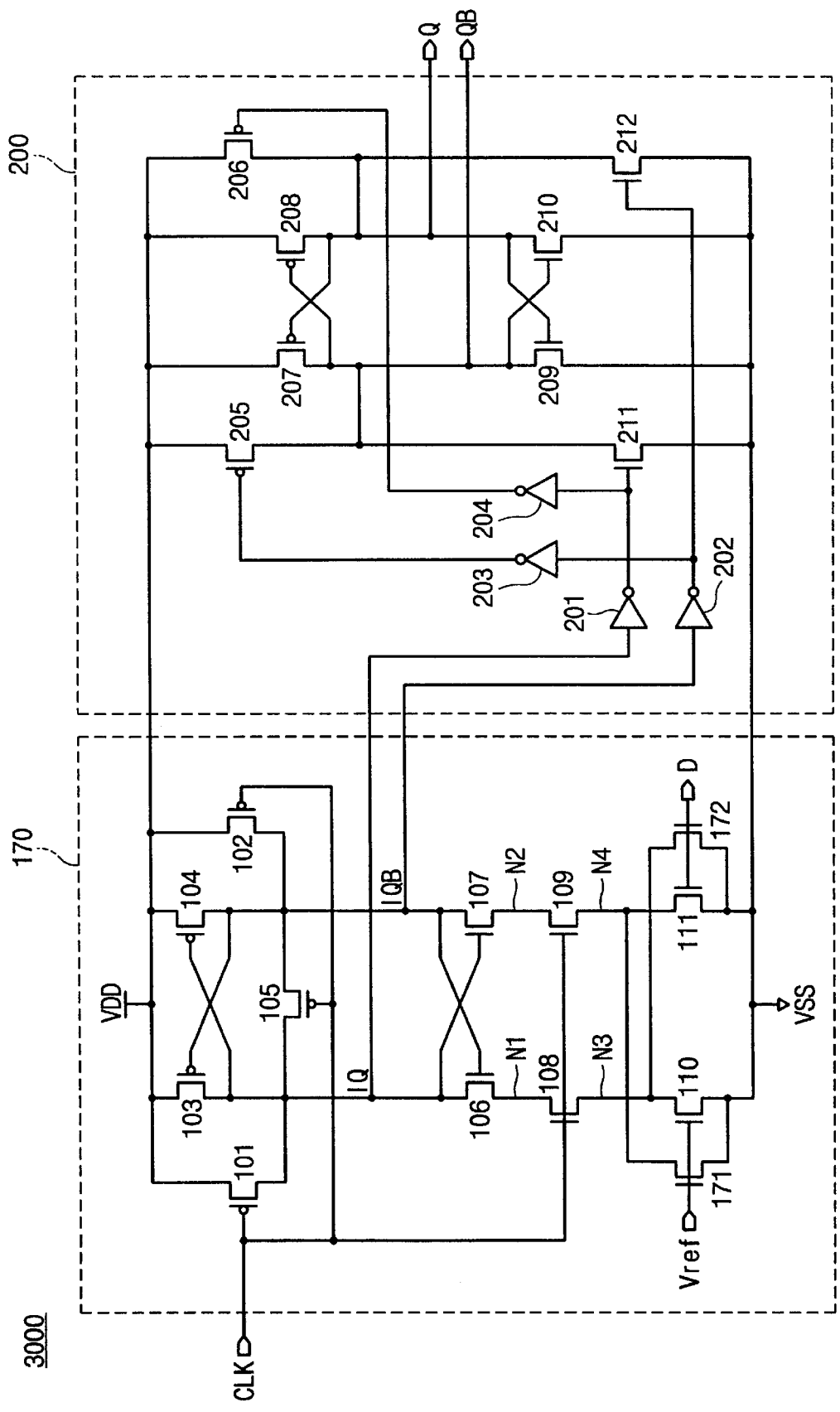

The receiver circuit 3000 shown in FIG. 5 further includes an NMOS transistor 171 connected between the node N4 and the ground voltage VSS, and an NMOS transistor 172 connected between the node N3 and the ground voltage VSS, in a first latched amplifier 170 (corresponding to 100 of FIG. 2). Gates of the NMOS transistors 171 and 172 are coupled to the reference voltage Vref and the data signal D, respectively. It should be noted that physical sizes of the NMOS transistors 171 and 172 are smaller than those of the differential input transistors 110 and 111.

The NMOS transistor 171 connects the node N4 to the ground voltage VSS when the differential input transistor 111 is turned off because a current voltage level of the data signal D is lower than the threshold voltage of the transistor 111. The transistor 172 discharges the drain voltages of the voltage detection transistors 106 and 107 with the same rate during a sensing operation for the data signal D.

As a result, the receiver circuit 3000 also prevents an inaccurate result of detecting a current voltage level of the data signal D, due to the coupling capacitance at the differential input transistor 111, when the clock signal CLK turns to a high level from a low level.

On the other hand, with the trends of higher integration density and lower power supply voltage for recent integrated circuits, the lower a voltage level is applied to the gates of the differential input transistors 110 and 111, the longer the discharging times of the nodes N3 and N4 are, resulting in longer setup/hold times at the output signals IQ and IQB. Such an effect due to the lower voltage level degrades an operation speed of the integrated circuit as a whole.

Figure 6:
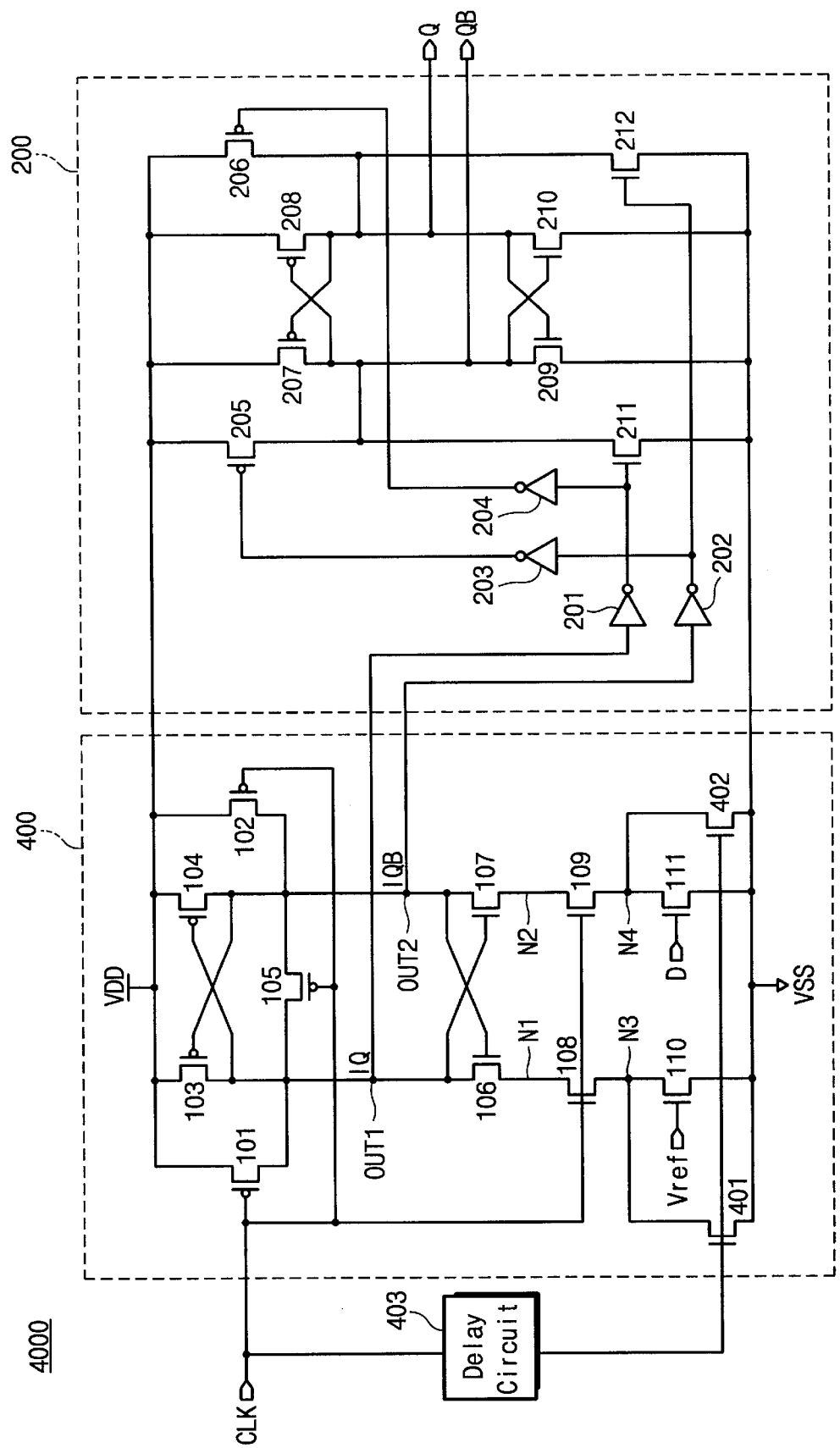

For the reason, the receiver circuit 4000 shown in FIG. 6 further employs, from the receiver circuit 1000 of FIG. 2, an NMOS transistor 401 connected between the node N3 and the ground voltage VSS, an NMOS transistor 402 connected between the node N4 and the ground voltage VSS, and a delay circuit 403 interposed between the clock signal CLK and gates of the NMOS transistors 401 and 402.

The delay circuit 403 controls a time of applying the clock signal CLK to the gates of the NMOS transistors 401 and 402, being composed of a plurality of inverters in an even number for example. When the clock signal CLK is in a low level, the NMOS transistors 401 and 402 are all turned off. If the clock signal CLK has passed through the delay circuit 403, lapsing a predetermined delay time thereof, after turning to a high level from a low level, the NMOS transistors 401 and 402 are simultaneously turned on to discharge the nodes N3 and N4. The turning-on of the transistors 401 and 402 accelerates the discharge of the nodes N3 and N4, which shorten the setup/hold times of the first differential signals IQ and IQB as output signals of the first latched amplifier 400.

Otherwise, the gates of the NMOS transistors 401 and 402 can be coupled to the clock signal CLK directly, so that the nodes N3 and N4 are discharged at the same time as the transition of the clock signal CLK to a high level from a low level.

On the other side in the receiver circuit 4000 of FIG. 6 (or any one of the receiver circuits of FIGS. 2 through 5), there would be another coupling capacitance at the differential input transistor 110 due to a capacitance difference between the voltage detection transistors 106 and 107 when the clock signal CLK turns to a high level from a low level unless the threshold voltages of the transistors 106 and 107 are completely identical to each other because of variations of manufacturing processes. Such a mismatch between the threshold voltages of the voltage detection transistors 106 and 107, i.e., a difference between their channel capacitance, may generate the kick-back noise varying the reference voltage Vref.

Figure 7:
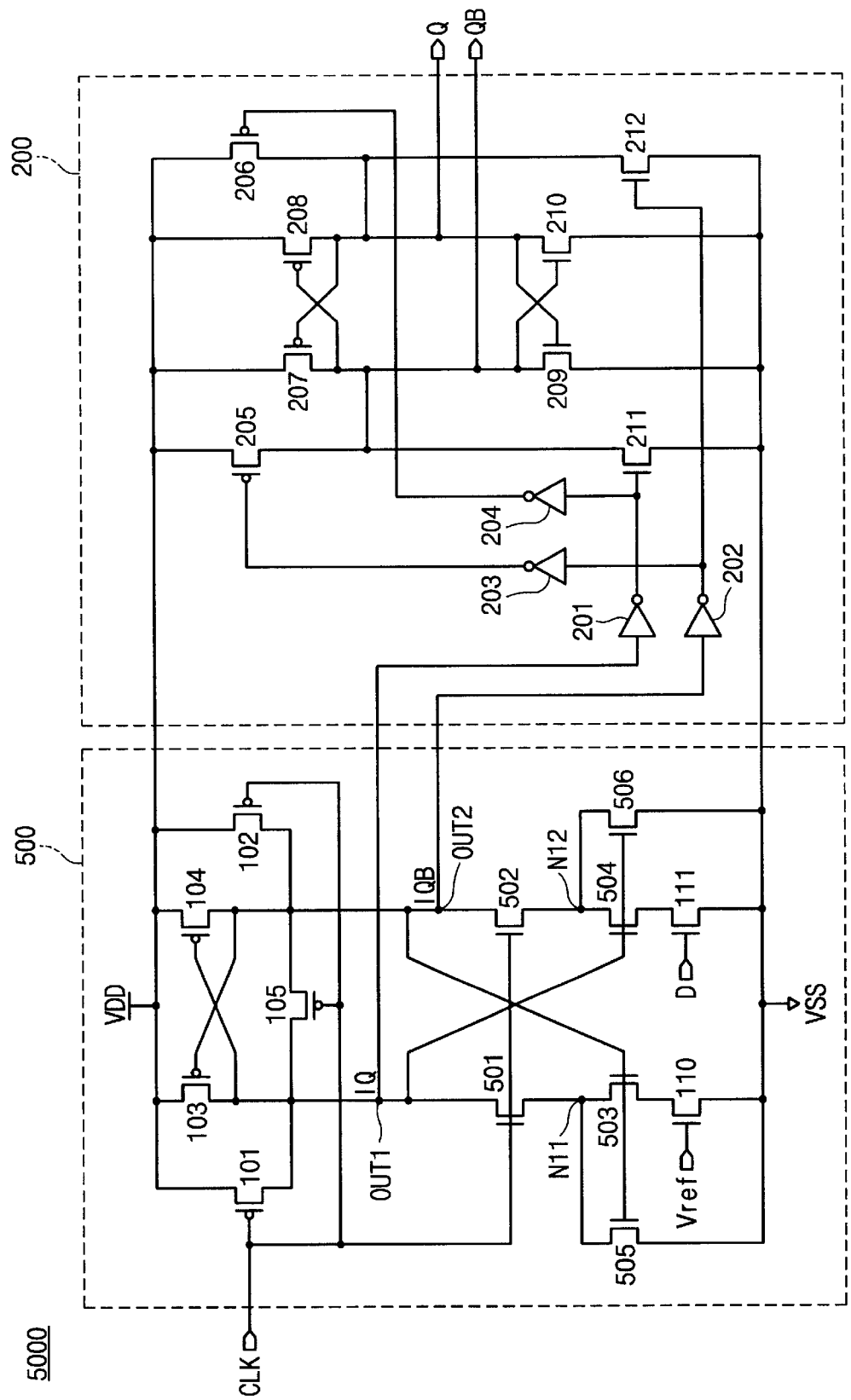

The receiver circuit 5000 shown in FIG. 7 is used in consideration of the predictable generation of the further coupling capacitance due to the unbalanced threshold voltages of the transistors 106 and 107. Referring to FIG. 7, the pair of the voltage detection transistors 503 and 504 is interchanged with the pair of the switching transistors 501 and 502 in their positions. Gates of the switching transistors 501 and 502 are coupled to the clock signal CLK in common, and gates of the voltage detection transistors 503 and 504 are coupled to the output nodes OUT2 and OUT1, respectively.

And, NMOS transistors 505 and 506 are added thereto as discharging means. The NMOS transistor 505 is connected between a node N11, which is located between the transistors 501 and 503, and the ground voltage VSS, and the NMOS transistor 506 is connected between a node N12, which is located between the transistors 502 and 504, and the ground voltage VSS. Gates of the NMOS transistors 505 and 506 are coupled to the output nodes OUT2 and OUT1, respectively.

In the first latched amplifier 500 of the receiver circuit 5000, the transistors 101 and 102 precharge the output nodes OUT21 and OUT2 up to the power supply voltage level when the clock signal CLK is in a low level. Therefore, the transistors 503~506 are all turned on. The nodes N1 and N2 are set on the ground voltage VSS because the switching transistors 501 and 502 are shut off.

When the clock signal CLK goes up to a high level from a low level, the switching transistors 501 and 502 are all turned on to supply VDD−Vth into the nodes N1 and N2. Then, the transistors 503 and 504 sense and amplify a voltage difference between the data signal D and the reference voltage Vref. At the same time of the transition of the clock signal CLK to a high level from a low level, the nodes N1 and N12 are discharged through the transistors 505 and 506.

As a result, it hardly affects the reference voltage because the nodes N1 and N12 fall down to the ground voltage VSS while the clock signal CLK retains a low level and maintains few rates of voltage variation thereof.

With respect to the embodiments described above, the invention provides receiver circuits enhancing the accuracy of sensing the data signal with suppressed kick noises arising from the coupling capacitance at the differential input transistors even when the reference voltage fluctuates. Further, the invention speeds up the operation of sensing a current voltage level of the data signal in a receiver circuit of an integrated circuit.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A receiver circuit converting a data signal to a pair of output signals in response to a clock signal, comprising:

a first circuit for developing a voltage difference between the data signal and a reference voltage and for outputting the voltage difference from a pair of terminals, when the clock signal is in a first state; and a second circuit for generating the output signals amplified from outputs of the first circuit;

wherein the first circuit comprises: an amplifier for precharging a pair of nodes thereof when the clock signal is in a second state and for developing a voltage difference between the nodes during the first state of the clock signal; a pair of switching transistors, being connected to the nodes, respectively, whose gates are coupled to the clock signal; and a pair of input transistors, connected between the switching transistors and a ground voltage, respectively, whose gates are coupled to the reference voltage and the data signal.

2. The receiver circuit of claim 1, wherein the switching transistors connect the nodes to the input transistors during the first state of the clock signal.

3. The receiver circuit of claim 1, wherein the first circuit further comprises a constant-current circuit for supplying a current statically to the output terminals during the first state of the clock signal.

4. The receiver circuit of claim 1, wherein the amplifier comprises:

a pair of precharge transistors, being connected between a power supply voltage and the output terminals, respectively, whose gates are coupled to the clock signal; and a pair of voltage detection transistors, being connected between the output terminals and the nodes, whose gates and drains are cross-coupled to each other.

5. The receiver circuit of claim 1, further comprising a pair of discharge transistors, being connected between the switching transistors and the ground voltage, whose gates are coupled to the clock signal.

6. The receiver circuit of claim 1, further comprising:

a delay circuit for transferring the clock signal with a predetermined delay time; and a pair of discharge transistors, being connected between the switching transistors and the ground voltage, whose gates are coupled to an output of the delay circuit.

7. A receiver circuit converting a data signal to a pair of output signals in response to a clock signal, comprising:

a first circuit for developing a voltage difference between the data signal and a reference voltage and for outputting the voltage difference from a pair of terminals, when the clock signal is in a first state; and a second circuit for generating the output signals amplified from outputs of the first circuit;

wherein the first circuit comprises: a power source for supplying a power supply voltage to the output terminals during the first state of the clock signal; an amplifier for precharging a pair of nodes thereof when the clock signal is in a second state and for developing a voltage difference between the nodes during the first state of the clock signal; a pair of switching transistors, being connected to the nodes, respectively, whose gates are coupled to the clock signal; and a pair of input transistors, connected between the switching transistors and a ground voltage, respectively, whose gates are coupled to the reference voltage and the data signal;

wherein the switching transistors connect the nodes to the input transistors during the first state of the clock signal.

8. The receiver circuit of claim 7, wherein the power source comprises a pair of constant-current transistors, whose gates and drains are cross-coupled to each other, being connected between the power supply voltage and the output terminals.

9. The receiver circuit of claim 7, wherein the amplifier comprises:

a pair of precharge transistors, being connected between a power supply voltage and the output terminals, respectively, whose gates are coupled to the clock signal; and a pair of voltage detection transistors, being connected between the output terminals and the nodes, whose gates and drains are cross-coupled to each other.

10. A receiver circuit converting a data signal to a pair of output signals in response to a clock signal, comprising:

a first circuit for developing a voltage difference between the data signal and a reference voltage and for outputting the voltage difference from a pair of terminals, when the clock signal is in a first state; and a second circuit for generating the output signals amplified from outputs of the first circuit;

wherein the first circuit comprises: a pair of nodes; a pair of precharge transistors, whose gates are coupled to the clock signal, being connected between a power supply voltage and the output terminals; a pair of constant-current transistors, being connected between the power supply voltage and the output terminals, respectively, whose gates and drains are cross-coupled to each other; a pair of nodes; a pair of voltage detection transistors, being connected between the output terminals and the nodes, whose gates and drains are cross-coupled to each other; a pair of switching transistors, being connected to the nodes respectively, whose gates are coupled to the clock signal; and a pair of input transistors, connected between the switching transistors and a ground voltage, respectively, whose gates are coupled to the reference voltage and the data signal, respectively.

11. The receiver circuit of claim 10, wherein the nodes are set on a predetermined voltage level by the precharge transistors, through the voltage detection transistors, when the clock signal is in a second state.

12. The receiver circuit of claim 10, wherein the switching transistors connect the nodes to the input transistors during the first state of the clock signal.

13. A receiver circuit converting a data signal to a pair of output signals in response to a clock signal, comprising:

a first circuit for developing a voltage difference between the data signal and a reference voltage and for outputting the voltage difference from a pair of terminals, when the clock signal is in a first state; and a second circuit for generating the output signals amplified from outputs of the first circuit;

wherein the first circuit comprises: an amplifier for precharging a pair of nodes thereof when the clock signal is in a second state and for developing a voltage difference between the nodes during the first state of the clock signal; a pair of switching transistors, being connected to the nodes, respectively, whose gates are coupled to the clock signal; a pair of input transistors, connected between the switching transistors and a ground voltage, respectively, whose gates are coupled to the reference voltage and the data signal; and a resistor connected between the input transistors.

14. The receiver circuit of claim 13, wherein the switching transistors connect the nodes to the input transistors during the first state of the clock signal.

15. The receiver circuit of claim 14, wherein the first circuit further comprises a constant-current circuit for supplying a current statically to the output terminals during the first state of the clock signal.

16. The receiver circuit of claim 15, wherein the constant-current circuit comprises a pair of constant-current transistors connected between a power supply voltage and the output terminals, respectively, whose gates and drains are cross-coupled to each other.

17. The receiver circuit of claim 14, wherein the amplifier comprises:

a pair of precharge transistors, being connected between a power supply voltage and the output terminals, respectively, whose gates are coupled to the clock signal; and a pair of voltage detection transistors, being connected between the output terminals and the nodes, whose gates and drains are cross-coupled to each other.

18. The receiver circuit of claim 14, further comprising an equalization transistor connected between the output terminals, equalizing voltage levels of the output terminals in response to the second state of the clock signal.

19. A receiver circuit converting a data signal to a pair of output signals in response to a clock signal, comprising:

a first circuit for developing a voltage difference between the data signal and a reference voltage and for outputting the voltage difference from a pair of terminals, when the clock signal is in a first state; and a second circuit for generating the output signals amplified from outputs of the first circuit;

wherein the first circuit comprises: an amplifier for precharging a pair of nodes thereof when the clock signal is in a second state and for developing a voltage difference between the nodes during the first state of the clock signal; a pair of switching transistors, being connected to the nodes, respectively, whose gates are coupled to the clock signal; a pair of input transistors, connected between the switching transistors and a ground voltage, respectively, whose gates are coupled to the reference voltage and the data signal; a first discharge transistor, being connected between one of the input transistors and the ground voltage, whose gate is coupled to the reference voltage; and a second discharge transistor, being connected between the other of the input transistors, whose gate is coupled to the data signal.

20. The receiver circuit of claim 19, wherein the switching transistors connect the nodes to the input transistors during the first state of the clock signal.

21. The receiver circuit of claim 19, wherein the first circuit further comprises a constant-current circuit for supplying a current statically to the output terminals during the first state of the clock signal, the constant-current circuit including a pair of constant-current transistors, whose gates and drains are cross-coupled to each other, being connected between a power supply voltage and the output terminals, respectively.

22. The receiver circuit of claim 19, wherein the amplifier comprises:
   a pair of precharge transistors, being connected between a power supply voltage and the output terminals, respectively, whose gates are coupled to the clock signal; and
   a pair of voltage detection transistors, being connected between the output terminals and the nodes, whose gates and drains are cross-coupled to each other.

23. The receiver circuit of claim 19, further comprising an equalization transistor connected between the output terminals, equalizing voltage levels of the output terminals in response to the second state of the clock signal.

24. A receiver circuit converting a data signal to a pair of output signals in response to a clock signal, comprising:
   a first circuit for developing a voltage difference between the data signal and a reference voltage and for outputting the voltage difference from a pair of terminals, when the clock signal is in a first state; and
   a second circuit for generating the output signals amplified from outputs of the first circuit;
   wherein the first circuit comprises: an amplifier for precharging a pair of nodes thereof when the clock signal is in a second state and for developing a voltage difference between the nodes during the first state of the clock signal; a pair of switching transistors, being connected to the nodes, respectively, whose gates are coupled to the clock signal; a pair of input transistors, connected between the switching transistors and a ground voltage, respectively, whose gates are coupled to the reference voltage and the data signal; and a pair of discharge transistors, being connected between the input transistors, respectively, and the ground voltage, whose gates are coupled to the reference voltage and the data signal respectively.

25. The receiver circuit of claim 24, wherein the switching transistors connect the nodes to the input transistors during the first state of the clock signal.

26. The receiver circuit of claim 24, wherein the first circuit further comprises a constant-current circuit for supplying a current statically to the output terminals during the first state of the clock signal.

27. The receiver circuit of claim 24, wherein the amplifier comprises:
   a pair of precharge transistors, being connected between a power supply voltage and the output terminals, respectively, whose gates are coupled to the clock signal; and
   a pair of voltage detection transistors, being connected between the output terminals and the nodes, whose gates and drains are cross-coupled to each other.

28. The receiver circuit of claim 24, further comprising:
   a delay circuit for transferring the clock signal with a predetermined delay time, the gates of the discharge transistors being coupled to a delayed clock signal provided from the delay circuit.

29. A receiver circuit converting a data signal to a pair of output signals in response to a clock signal, comprising:
   a first circuit for developing a voltage difference between the data signal and a reference voltage and for outputting the voltage difference from a pair of terminals, when the clock signal is in a first state; and
   a second circuit for generating the output signals amplified from outputs of the first circuit;
   wherein the first circuit comprises: a pair of precharge transistors, whose gates are coupled to the clock signal, being connected between a power supply voltage and the output terminals; a pair of constant-current transistors, being connected between the power supply voltage and the output terminals, whose gates and drains are cross-coupled to each other; a pair of switching transistors, being connected to the output terminals, respectively, whose gates are coupled to the clock signal; a pair of voltage detection transistors, being connected to the switching transistors, respectively, whose gates are cross-coupled to the output terminals, respectively; a pair of input transistors, connected between the switching transistors and a ground voltage, respectively, whose gates are coupled to the reference voltage and the data signal; and a pair of discharge transistor, being connected between the input transistors, respectively, and the ground voltage, whose gates are coupled to the reference voltage and the data signal, respectively.

30. The receiver circuit of claim 29, wherein drain nodes of the voltage detection transistors are connected to source nodes of the switching transistors and the drain nodes are set on the ground voltage during the second state of the clock signal.

* * * * *

UNITED STATES PATENT AND TRADEMARK OFFICE
CERTIFICATE OF CORRECTION

PATENT NO. : 6,744,284 B2
DATED : June 1, 2003
INVENTOR(S) : Chang-Sik Yoo *et al.*

It is certified that error appears in the above-identified patent and that said Letters Patent is hereby corrected as shown below:

<u>Title page,</u>
Item Notice [*], please delete "Subject to any disclaimer, the term of this patent is extended or adjusted under 35 U.S.C. 154(b) by 0 days." and insert -- Subject to any disclaimer, the term of this patent is extended or adjusted under 35 U.S.C. 154(b) by 78 days. --.

Signed and Sealed this

Seventh Day of September, 2004

JON W. DUDAS
*Director of the United States Patent and Trademark Office*